United States Patent [19]
Soref et al.

[11] Patent Number: 5,880,491
[45] Date of Patent: Mar. 9, 1999

[54] SIC/111-V-NITRIDE HETEROSTRUCTURES ON SIC/SIO$_2$/SI FOR OPTOELECTRONIC DEVICES

[75] Inventors: Richard A. Soref, Newton Centre; Fereydoon Namavar, Westford, both of Mass.

[73] Assignee: The United States of America as represented by the Secretary of the Air Force, Washington, D.C.

[21] Appl. No.: 791,341

[22] Filed: Jan. 31, 1997

[51] Int. Cl.$^6$ .......................... H01L 29/15; H01L 33/00; H01L 31/101

[52] U.S. Cl. .......................... 257/190; 257/77; 257/200; 257/18; 257/21; 257/22; 257/97

[58] Field of Search .......................... 257/77, 190, 200, 257/507, 21, 22, 96, 97, 18

[56] References Cited

U.S. PATENT DOCUMENTS

| | | | |
|---|---|---|---|
| 5,563,428 | 10/1996 | Ek et al. | 257/77 |
| 5,671,914 | 9/1997 | Kalkhoran | 257/77 |
| 5,684,309 | 11/1997 | McIntosh | 257/97 |

OTHER PUBLICATIONS

Pazik et al, *Appl. Phys. Lett* 58 (13) 1 Apr. 1991 "Epitaxial Growth . . . deposition".

Steckl et al *Appl. Phys Lett* 69 7 Oct 1996 "SiC rapid . . . , GaN".

Morkoc et al. *J. Appl. Phys* 76 (3), 1 Aug. 1994 "Large-band-gap in technologies".

Steckl et al *J. Electroch. Soc.* vol. 141 No. 6 Jun. 1994 "SiC Silicon-on Insulator in Silacyclobutane".

King et al, *GaN and Related Materials* First Int. Symp. . . . Nov. 27–Dec. 1, 1995 "XPS Measurement . . . Interface" pp. 375–380.

*Primary Examiner*—Jerome Jackson, Jr.
*Attorney, Agent, or Firm*—Robert L. Nathans

[57] ABSTRACT

A low-cost Si-based construction for optical and electronic bulk-heterostructure devices and multiple-quantum-well devices in which the active layers of the device are SiC or AlGaN or InGaN or InAlN. Material quality is high, and the MQW devices such as blue light lasers or LEDs have stable pseudomorphic layers with low defect densities. The low-cost large-area 3C SiC substrate is created by converting 100% of a 100–500 angstrom (Å) layer of Si in a silicon-on-insulator wafer to 3C SiC with propane at 1300 degrees C. The SiO2 layer provides strain-free support for the "perfect" 3C SiC crystal layer. Direct-gap wurtzite nitride heterostructures, bulk or pseudomorphic MQW, are grown upon an (0001) 6H SiC epilayer on the (111) 3C SiC substrate, or directly upon the (111) 3C SiC substrate. For zincblende heterostructures, a (100) 3C SiC substrate is used.

4 Claims, 10 Drawing Sheets

| SEMICONDUCTOR | LATTICE-PARAMETER a (Å) | LATTICE-PARAMETER c (Å) | LATTICE MISMATCH OF (a) TO CARBIDE (%) | ENERGY GAP (eV) | TOTAL BAND OFFSET TO CARBIDE (eV) |
|---|---|---|---|---|---|
| 3C SiC | 4.36 | --- | --- | 2.3 ind. | --- |
| z-AlN | 4.38 | --- | 0.46 | 5.11 ind. | 2.81 |
| z-GaN | 4.52 | --- | 3.67 | 3.25 dir. | 0.95 |
| z-InN | 4.98 | --- | 14.22 | 2.2 ind. | -0.10 |
| 6H SiC | 3.08 | 15.12 | --- | 2.9 ind. | --- |
| w-AlN | 3.112 | 4.982 | 1.04 | 6.2 dir. | 3.30 |
| w-GaN | 3.189 | 5.185 | 3.54 | 3.39 dir. | 0.49 |
| w-InN | 3.548 | 5.760 | 15.19 | 1.89 dir. | -1.01 |

FIG. 13

SIC/III-V-NITRIDE HETEROSTRUCTURES ON SIC/SIO₂/SI FOR OPTOELECTRONIC DEVICES

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of semiconductor electro-optic devices.

The commercial optoelectronic device development of modern silicon carbide and III-V nitride technology has been hampered by three un-met needs. First there is a strong need for a low cost substrate. The prior art employs commercial SiC wafers that cost $1000 each. This cost is ten to twenty times higher than a desired target cost. Second, it is desirable to "link" the substrate to a silicon wafer so that Si electronics can be integrated with optoelectronic SiC and nitride devices. Third, there is a need for multiple quantum well devices; that is, a material platform is required that will allow pseudomorphic growth of the appropriate nitride and carbide layers. A fourth prior-art problem concerns the growth of nitrides on a sapphire substrate. Since it is difficult to cut and cleave the sapphire, the development of a Fabry Perot nitride laser on sapphire is inhibited or prevented. By contrast, this invention provides a "friendly" substrate for nitride lasers, because our. SiCOI substrate unit is easy to cleave.

BRIEF SUMMARY OF THE INVENTION

These problems and needs will be met in accordance with a preferred embodiment of the invention by converting 100% of a 100–500 Å layer of Si of a silicon-on-insulator wafer to 3C SiC with propane at about 1300 degrees C. The $SiO_2$ layer provides strain-free support for the resulting "perfect" 3C SiC crystal layer. Direct-gap wurtzite nitride heterostructures, bulk or pseudomorphic MQW, are grown upon an (0001) 6H SiC epilayer on the (111) 3C SIC substrate. For zincblende heterostructures, a (100) 3C SiC substrate is used.

Thus the resulting novel electro-optic component has a silicon carbide-on-insulator substrate (SiCOI) unit having an upper silicon carbide crystalline layer of a thickness of about 500 angstroms or less and a heterostructure epitaxially formed upon the upper silicon carbide crystalline layer of the SiCOI substrate unit, which could be zincblende bulk heterostructures, Wurtzite-bulk heterostructures, zincblend heterostructures having a pseudomorphic stack of multiple quantum wells, and Wurtzite heterostructures having a pseudomorphic stack of multiple quantum wells.

BRIEF DESCRIPTION OF THE DRAWINGS

The various features and advantages of the invention will be more fully understood by study of the following detailed description, taken in conjunction with the drawings in which:

FIG. 13 illustrates a table useful in the understanding of the invention.

DETAILED DESCRIPTION OF PREFERRED EMBODIMENTS OF THE INVENTION

To understand the epitaxial structures in this invention, we first consider the physical constants. The physical properties of the carbides and nitrides are summarized in the table of FIG. 13, relating to various values listed in Morkoc et al, Journal of Applied Physics, vol. 76, p. 1363, 1994. For the cubic materials, it is seen that zincblende AlN lattice has a near match (0.5%) to (100) 3C SiC. Hence, stable AlN epilayers of several hundred angstroms (Å) of pseudomorphic aluminum nitride (AlN) will grow on 3C SiC. Zincblende GaN, at 3.7% mismatch, could not be grown very thick on 3C SiC without exceeding the critical thickness for stable strain. On the other hand, a small amount of about 30% GaN, could be added to AlN in the binary alloy GaxAl1-xN, and that alloy would have a "sufficiently close" lattice match to 3C SiC to make GaAlN viable for stable strained layers. Smaller amounts of InN (about 10% InN) could be added to AlN for commensurate InAlN alloys on 3C SiC. Regarding the total band offset (valence band plus conduction band offsets), we see that z-AlN has a large 2.8 eV offset versus the cubic carbide, with an GaAlN offset of roughly 2 eV. These are quite useful in a variety of devices, especially in intersubband devices designed to work in the near infrared at the 1.3–1.55 micron fiber optic communications wavelengths.

Considering the wurtzite case indicted in the table of FIG. 13, the a-axis lattice mismatch of the three wurzite nitrides with respect to hexagonal 6H SiC follows the same pattern as the lattice matching of zincblende nitrides to the cubic carbide; that is, w-AlN is only 1% larger than 6H SiC, while w-GaN is 3.5% larger and w-InN is highly mismatched. Clearly w-AlN is an excellent buffer candidate for commensurate growth on 6H SiC. The addition of modest amounts of GaN to AlN, or tiny fractions of InN to AlN, would allow stably strained films of GaAlN or InAlN on 6H SiC. The c-parameter in the biaxially strained epi film takes on whatever value is needed to conserve volume in the crystal's unit cell. The band offsets are large for AlN and small for GaN.

Regarding bulk heterostructures on SiC, the subsequent nitride and/or carbide films could be made thick; that is, above the critical thickness. In that case, the epilayers would be strain-relaxed and would have their bulk lattice parameters. Defects would be "confined" at the bottom of the first relaxed layer and would not affect the device. For example, one could grow z-InGaN on z-GaN upon relaxed z-AlN upon 3C SiC. There is some basis for thinking that the AlN defect density could be kept below 10-6e or 10-5e per cm sq. for that heterostructure, adequate for electronic devices. Low defect densities are also anticipated in w-InGaN upon w-GaN upon relaxed wAlN upon 6H SiC.

Figure 1A:
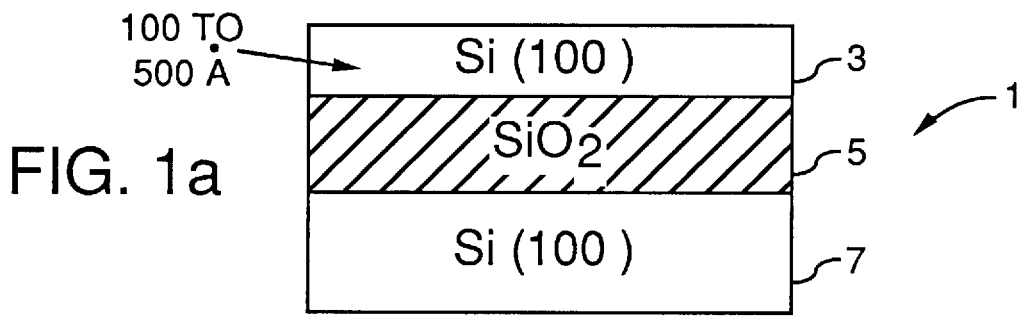
Figures 1a–1c and FIGS. 2 a–2c illustrate carbonation of commercially available silicon-on-insulator substrate wafers to produce Silicon Carbide-on-Insulator (SiCOI) substrates.
Figure 1B:
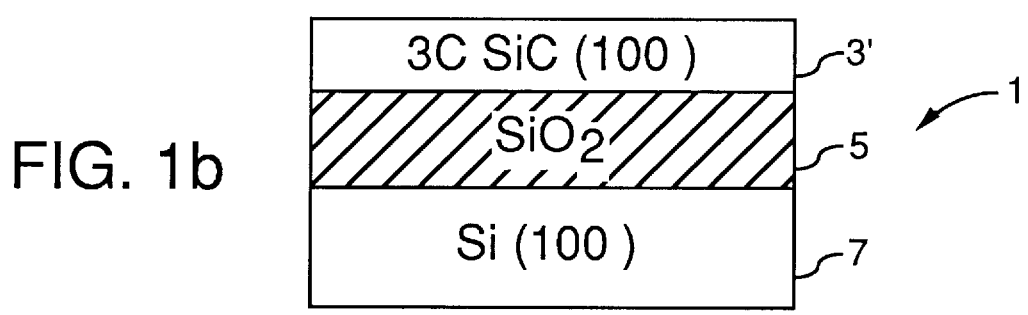
Figure 1C:
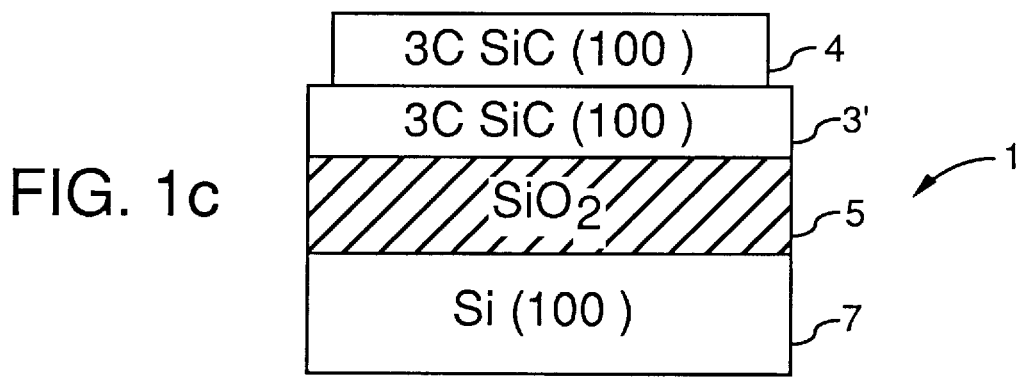

The process for making our novel SiCOI substrate unit begins with a low-cost, large area platform shown in FIG. 1a. The starting point is an ultrathin SOI wafer 1, such as a "SIMOX" wafer with 100 to 500 angstrom (Å) layer of crystal silicon 3, most preferrably 200–300 Å, over SiO2 layer 5 upon silicon substrate 7, which wafer was first developed by Spire Corporation of Bedford, Mass. and described in the publication "Ultrathin SOI Structures by Low Energy Oxygen Implantation", Namavar et al, Materials Research Society Symposium Proceedings, vol. 235, p. 109, 1992. During the next five years, we expect such wafers to be available from several companies at less than $200. In an ambient gas of propane, diluted in a hydrogen carrying gas, for carbonization of the silicon, the SOI wafer 1 is heated rapidly to about 1300 degrees C. in a low-mass susceptor. A 4.5 minute rapid thermal ramp from room temperature to about 1300 degrees C. would be typically employed. Advantageously, this process can easily accomodate a wafer that has a large diameter, such as 8 inches. In less than a minute, the entire top layer 3 of Si (100) is converted into 3C SiC having the same crystal orientation as the original Si film. The carbonization can be partial or complete, and the converted layer 3' is shown in FIG. 1b. Mobile Si atoms come to the surface, and there is an exchange reaction between the C propane atoms and the Si atoms to form the cubic crystal SiC compound. The process is illustrated in FIGS. 1a–1c. The preferred 100–500 angstrom silicon film prior to carbonization, is preferred because experimentally this thickness results in a very low defect density 3C SiC as demonstrated by double crystal X-ray rocking curves. Also, we have chosen the (100) crystal orientation for the original SOI wafer layer 3, so that the resulting SiC will also have a (100) orientation, thereby facilitating the growth of zincblende nitride materials upon it.

Regarding the prior art, Steckl et al., J. Electrochem. Soc., vol. 141, p. L66, 1994, used a 1000 Å layer of Si on top of the wafer which they carbonized and converted. They did not show TEM photos or electron diffraction or lattice imaging to indicate crystal quality. From knowledge of the 1000 Å Si starting material in their commercial SIMOX, we infer that the crystal quality of their converted SiC was not high, that is, not device quality. See also, A. J. Steckl et al., Applied Physics Letters, vol. 69, page 2264 (7 Oct. 1996). Again, he starts with 1000 angstroms of Si, and we believe that his resulting silicon carbide has a much higher density of defects than our material. The distinction between the substrate unit of our invention and the prior art is the use of ultrathin Si, having a thickness of about 500 Å or less, which can be converted to 3C SiC having much better crystal quality, and many fewer defects per cm sq. If desired, the thickness of our 3C SiC film can be increased by an added epitaxy of a layer 4 of 3C SiC on the original 3C SiC 3' using standard chemical vapor deposition.

Figure 2A:
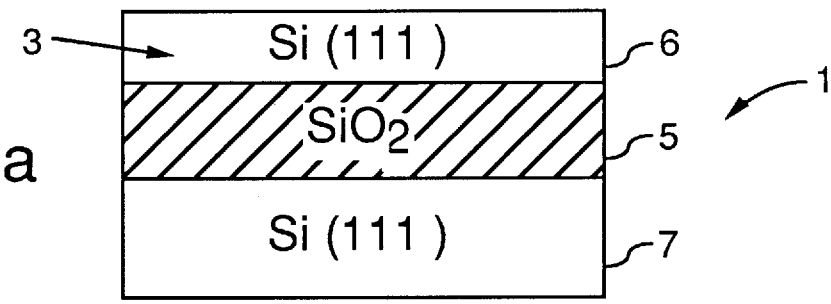
Figure 2B:
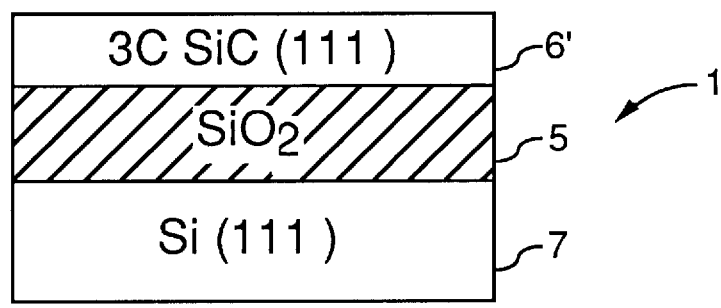
Figure 2C:
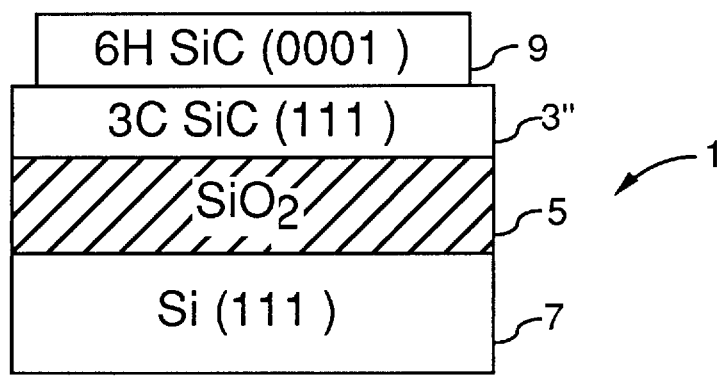
Figure 6:
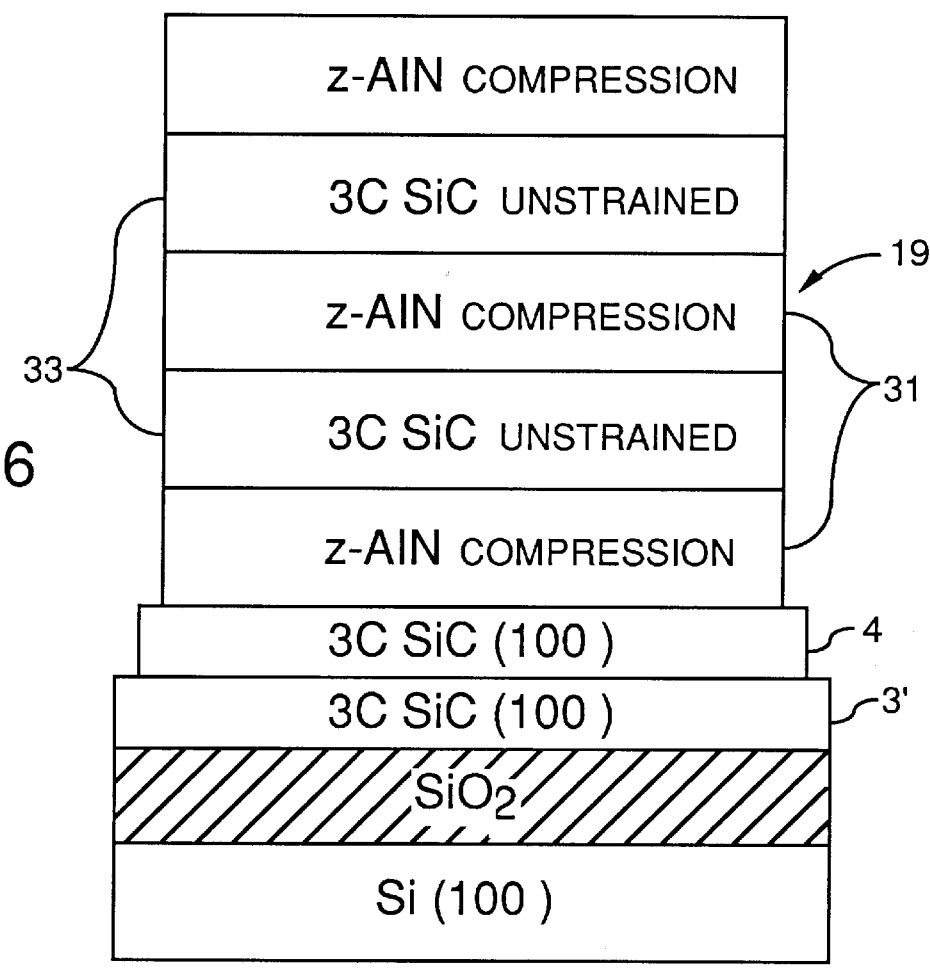
FIG. 6 illustrates a zincblende case with a pseudomorphic stack of multiple quantum wells (MQWs)

We show in FIG. 2 an important substrate for hexagonal materials. The first two steps are the same as in FIG. 1, but the third step is different. Here, we choose a (111) orientation for the original SOI wafer in steps 1 and 2. The resulting 3C SiC (111) 6' of FIG. 2b, also exhibits the (111) plane. According to a recent article by Morkoc et., J. of Applied Physics, vol. 76, p. 1363, 1994, it is entirely possible to grow a basal plane film 9 of 6H SiC (0001) directly on top of the 3C SiC (111) as shown in FIG. 2c. This epitaxy, which can be the third step of our FIG. 2 process, is shown in FIG. 6 of their paper, where they state that the resulting 3C/6H heterojunction is coherent, lattice-matched and presumably free from defects. Although the physical basis for this was not spelled out in the article, we believe that the (111) plane of 3C SiC exposes triangular arrays of atoms, useful for matching a hexagonal lattice, and that the inter-atom spacing in the triangles is the 4.36 Å lattice parameter of 3C SiC, divided by the square root of two; which in turn is equal to the 3.08 Å lattice a-parameter of 6H SiC.

The new combination of the 6H film 9 with the SICOI substrate unit 1 results in the FIG. 2c structure, providing a novel, excellent low-cost substrate for hexagonal wurtzite materials. In addition to the nitrided structures discussed below, we should emphasis that the SiCOI substrate units of FIGS. 1 and 2 are excellent substrates for SiC MOSFETS, SiC JFETS, SiC MESFETS, SiC bipolar transistors, SiC LEDs, SiC photodiodes and SiC rectifiers.

Figure 3A:
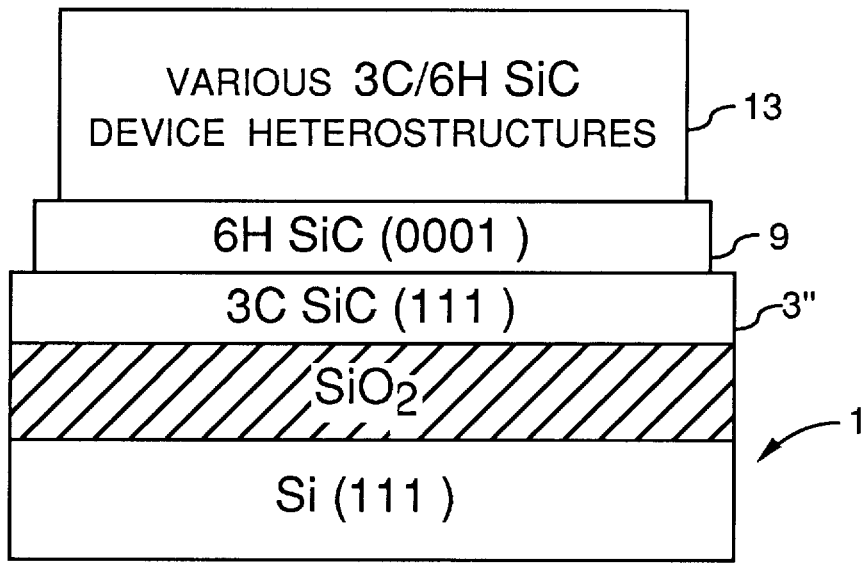
FIGS. 3a and 3b illustrate placement of various electro-optic heterostructures over the SiCOI substrate wafer.
Figure 3B:
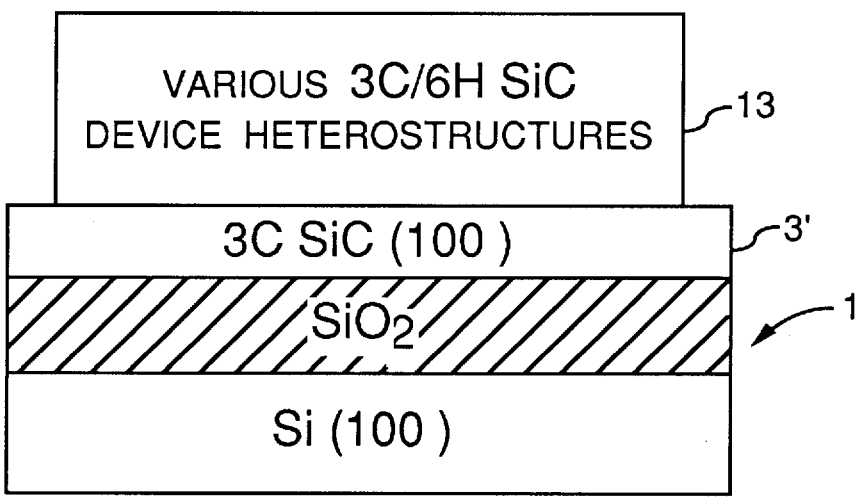
Figure 4:
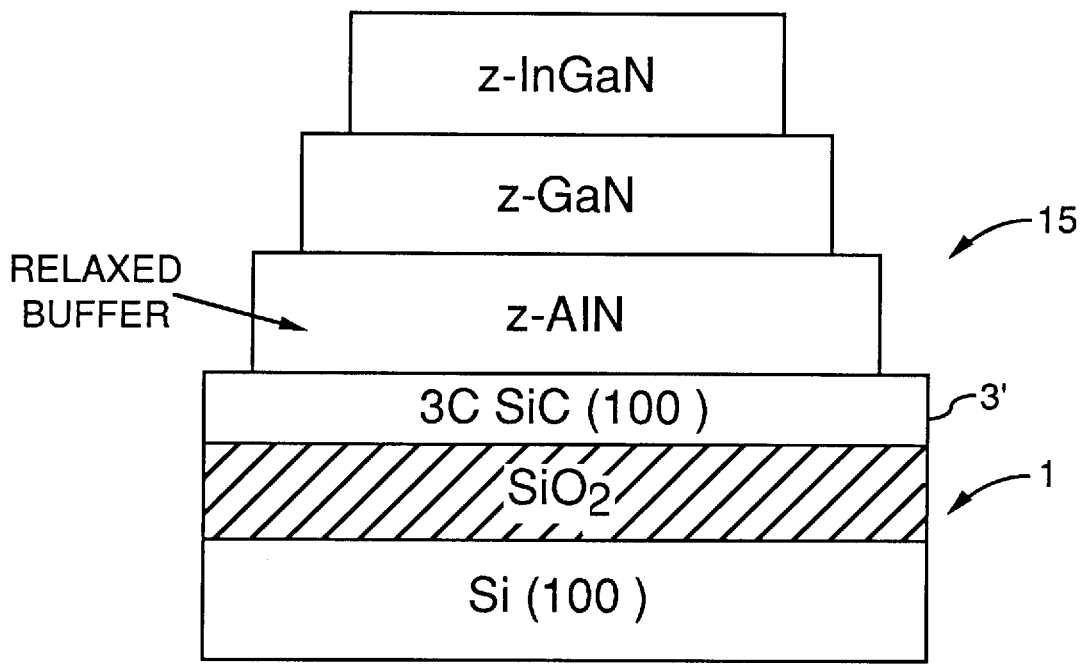
FIG. 4 illustrates growth of a zincblende-bulk heterostructure upon a SiCOI substrate.

The present invention also teaches how to grow the high-quality layers of a nitride device, a SiC device or a SiC/nitride device. Crystallographically, there are zincblende and wurtzite structures, and these in turn are divided into bulk heterostructures, and superlattice structures. In turn, the superlattice structures, (by which we mean multiple quantum well structures), can be divided into those without a buffer layer and those containing a strain-relaxed buffer layer. Some of the MQWs have active SiC layers: other MQWs have active III-V nitride layers. All devices are potentially low in cost. First we show bulk structures. FIGS. 3a and 3b show schematically the electro-optic devices mentioned above. The rectangle 13 on the substrate represents these device structures. FIG. 4 represents schematically a novel zincblende bulk optical device 15 such as a blue LED.

Figure 5:
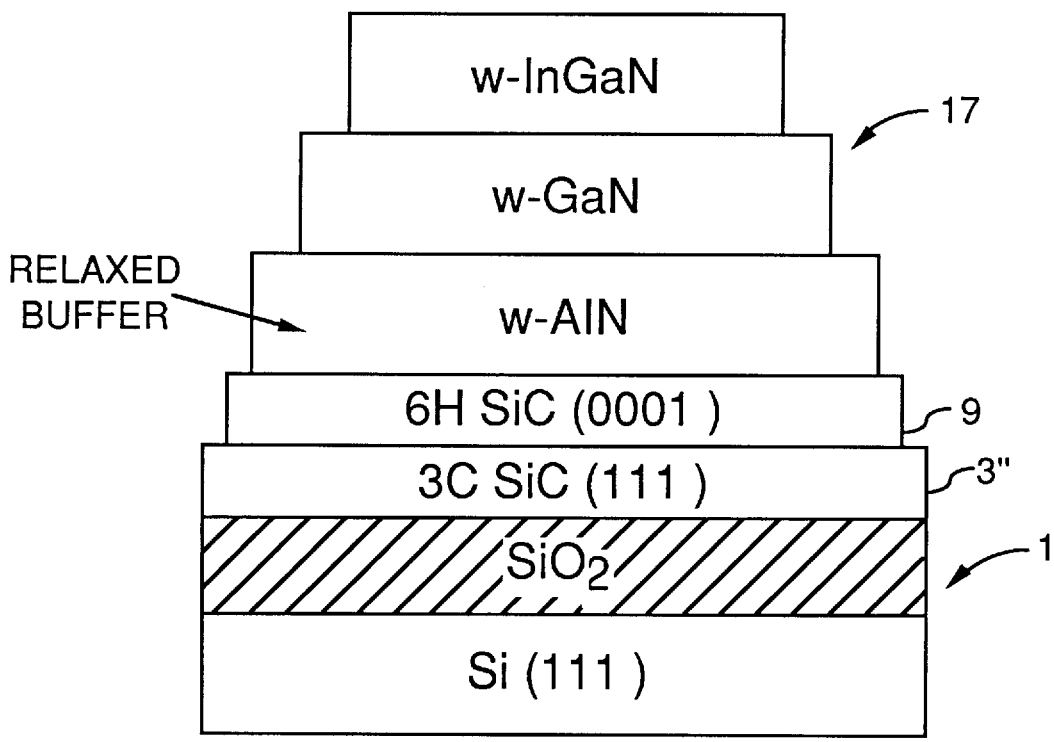
FIG. 5 illustrates growth of a Wurtzite-bulk heterostructure upon a SiCOI substrate.

FIG. 5 represents a wurtzite bulk optical device such as a blue LED, which is very efficient in the sapphire based versions. The nitride "superstructure" 17 is known in the prior art; however, the combination of our new SICOI substrate, and this structure is novel. The 6H layer 9 results in better epitaxial growth but is still optional. Depending upon the growth temperature of the w-AlN layer, the nitride structure 17 can be grown either upon the 6H SiC or directly upon the (111) 3C SiC layer 3 ".

Figure 7:
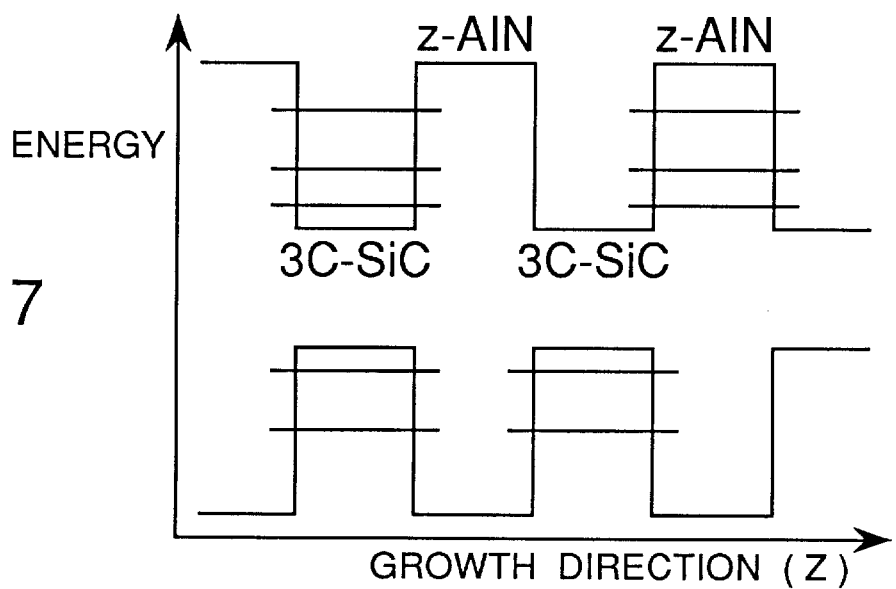
FIG. 7 illustrates an energy band diagram for the MQW stack of FIG. 6.
Figure 8:
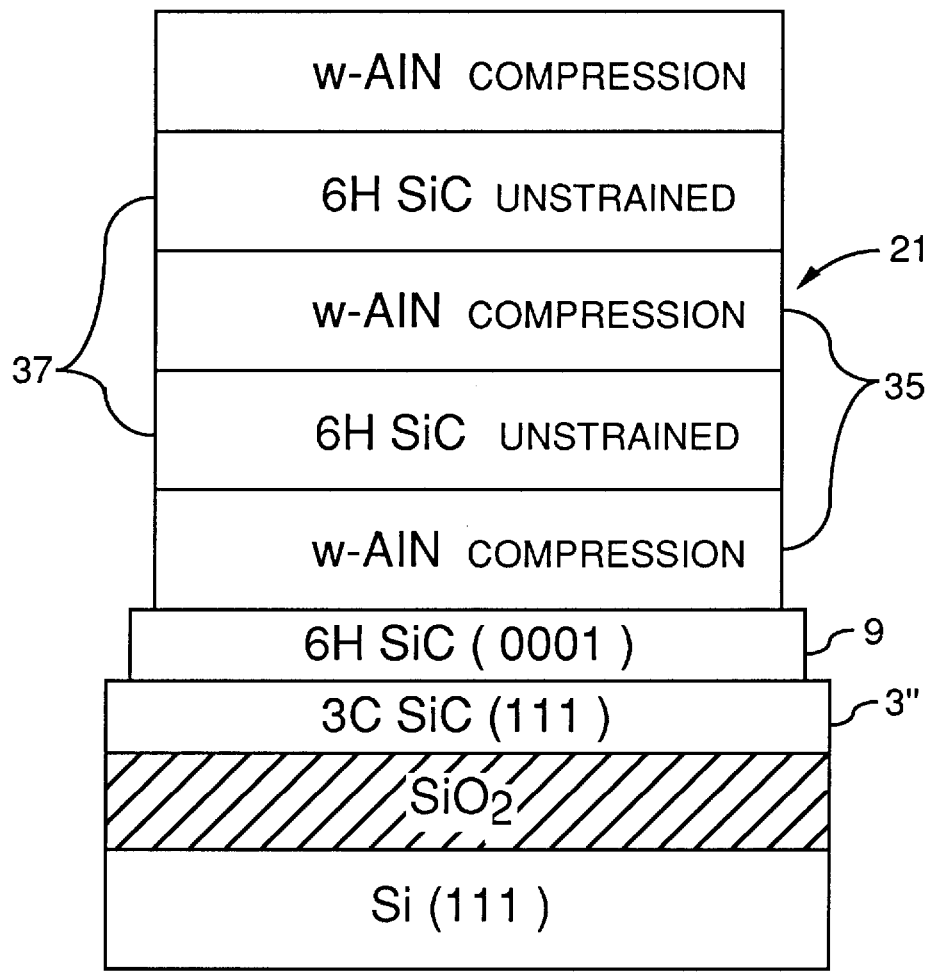
FIG. 8 illustrates a Wurtzite case with a pseudomorphic stack of MQWs.
Figure 9:
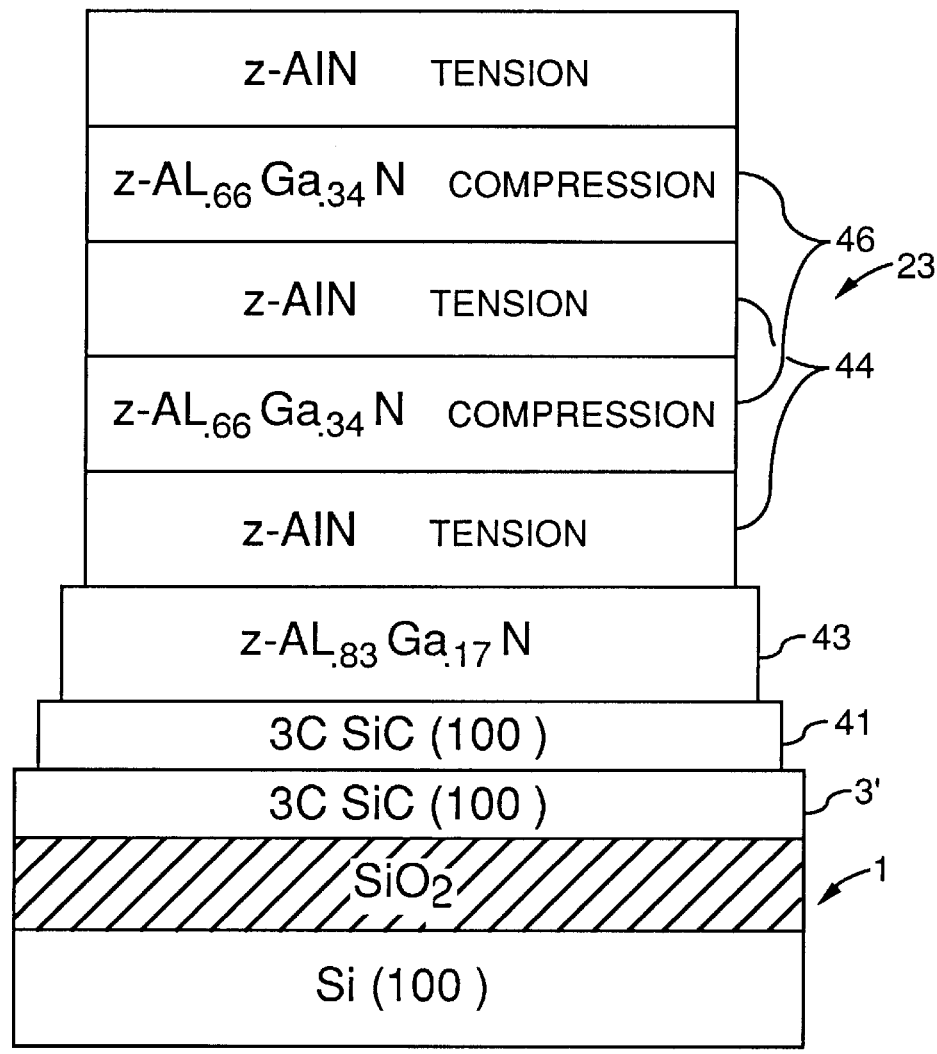
FIG. 9 illustrates a zincblende device with a relaxed buffer layer.
Figure 11:
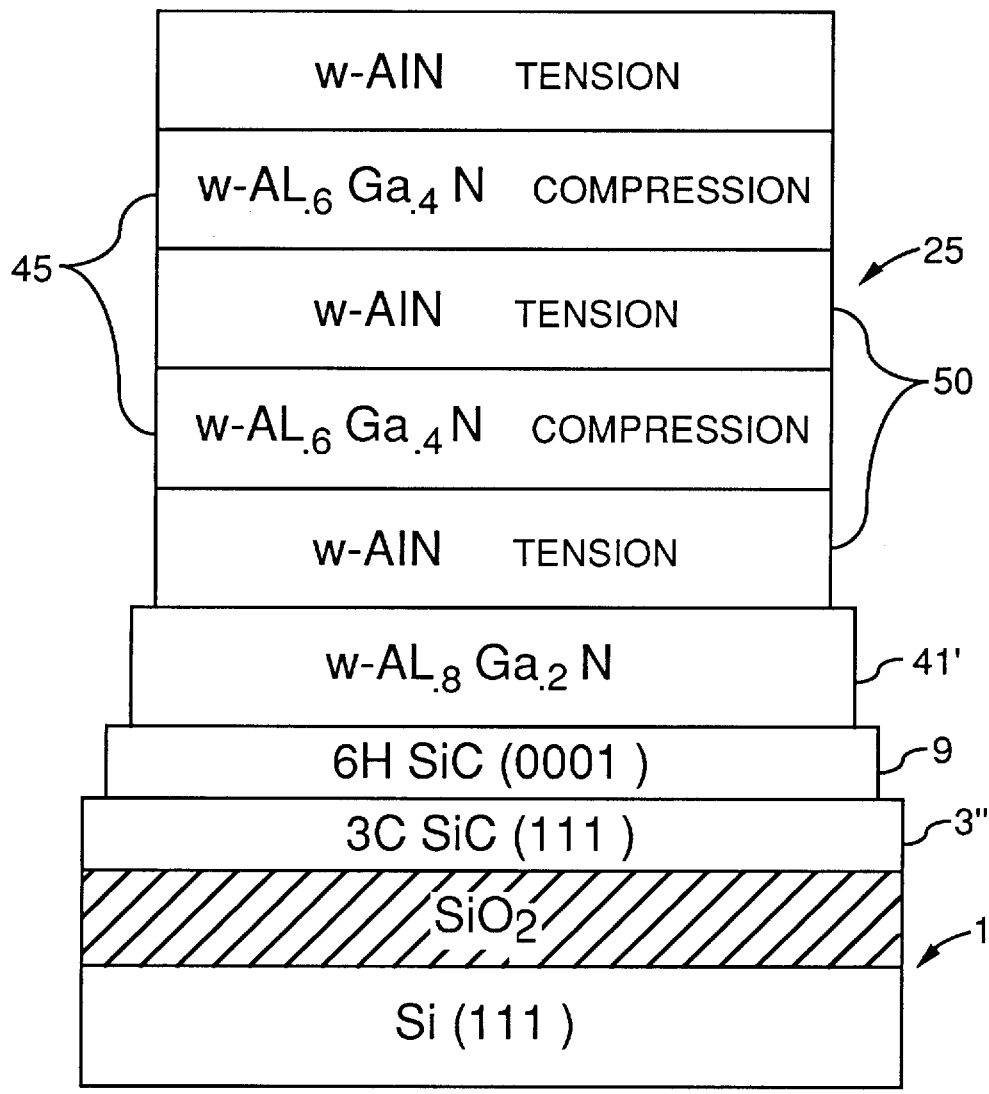
FIG. 11 illustrates a Wurtzite device with a relaxed buffer layer.

Now we turn to pseudomorphic MQW device heterostructure layers or stacks 19 of FIG. 6, stacks 21 of FIG. 8, stacks 23 of FIG. 9, and stacks 25 of FIG. 11. To our knowledge all of these MQWs are new. All of the layers are stably strained (biaxially strained) and have the same lattice constant (a) as the substrate or buffer layer. Stable strain implies excellent crystal quality with low defect density. FIG. 6 shows a zincblende MQW 19 in which the z-AlN layers 31 are barriers, and the unstrained 3C SiC layers 33 are quantum wells. An energy band diagram for the MQW of FIG. 6 is presented in FIG. 7 where we see that the 3C SiC is active, optically and electrically, because carriers are confined in it. The SiC wells 33 are unstrained, and the z-AlN has compressive coherent strain. The barriers are high, which is very useful for near infrared intersubband technology. The z-AlN layers 31 under compression in the MQW stack of FIG. 6 could also be z-GaAlN or z-InAlN (with the 30% or 10% composition limit, in order to make the GaAlN or INAlN pseudomorphic). Another possibility, not shown, is to make the quantum wells out of an alloy SIC-AlN. Of course, some of the layers in FIG. 6, near the top and the bottom of the MQW stack, would be doped p+ or n+ for electrical contacting and biasing required in devices. A challenge during growth is to maintain sharp interfaces between nitride and carbide, and to prevent inter-diffusion of atoms. Since carriers are quantum confined at the interface between a polar semiconductor and a covalent semiconductor, the relative size of valence and conduction band offsets will be effected. Researchers are now working on the growth of SiC and GeC alloys. Hence, it may be feasible to make the MQW layers in FIG. 6 from $Si_{1-x}C_x$ or $Ge_{1x}-C_x$, with x–0.5.

FIG. 8 shows the wurtzite MQW heterostructure 21, where unstrained 6H SiC layers 37 are the (active) quantum wells and w-AlN, or the alloys, layers 35 under compression are the barriers. The stack has a lattice constant of 3.08 angstroms, and the w-AlN layers could be GaAlN or InAlN. The MQW diagram for this device is similar to FIG. 7. As before, certain layers are doped.

Figure 10:
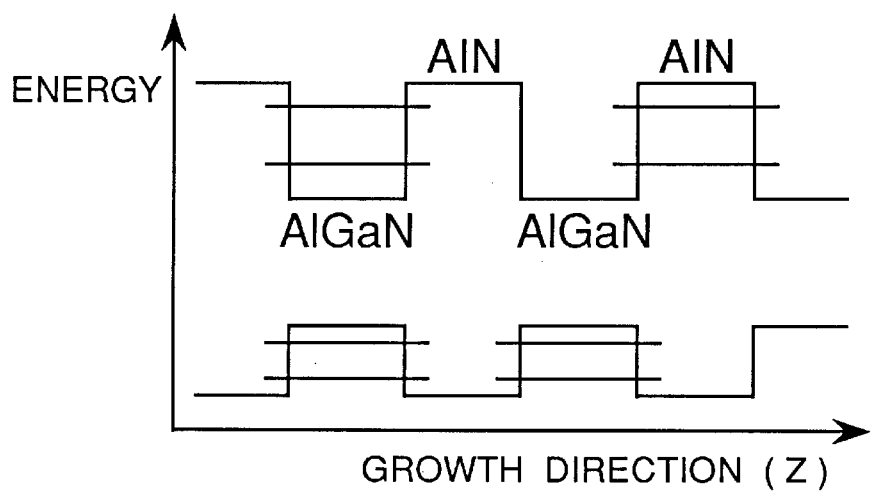
FIG. 10 illustrates an energy band diagram associated with the device of FIG. 9.

The final two MQW structures to be discussed are grown upon a relaxed buffer layer 43 of FIG. 9, situated on the SICOI substrate unit 1. The crystalline buffer is slightly mismatched with respect to the SiC substrate 3', and is thick enough, for example 2 microns, so that it is beyond the critical thickness for stable strain and is thus strain relieved, taking on its own bulk lattice parameter. Most of the defects are pinned at the optional SiC/buffer interface, so that the top of the buffer has crystal perfection for epitaxial growth of the lattice matched pseudomorphic zincblende MQW stack 23. The lattice parameter a=4.36 angstroms for optional buffer layer 41. The stack lattice mismatch, w.r.t. buffer, is plus or minus 0.5%. Also, the z-AlN layers 44 could be aluminum rich InAlN. Here, the lattice parameter of the AlGaN buffer 43 is chosen to be 4.404 Å, for example. In that case, we can get a near lattice match to AlN and its nitride alloys. This means that we can grow a device 23 with AlGaN layers as quantum wells (rather than SiC) and AlN layers 44 as barriers. This is shown schematically in the energy band diagram of FIG. 10. The band offsets here are small, so the optical devices will tend to use band-to-band transitions rather than intersubband, although the 500 meV offsets might be acceptable in some intersubband cases.

FIG. 11 shows the AlGaN buffered wurtzite MQW stack 25, again with active AlGaN layers 45 in compression and w-AlN layers 50 in tension. A relaxed AlGaN buffer layer 41' is also shown. Here the quantum wells (diagram like FIG. 10) have a direct bandgap which is quite useful in the optical case. For the stack and buffer layer, a=3.143 Å and for the 6H layer 9, a=3.08 angstroms. The w-AlN layers 50 could be aluminum rich InAlN.

A list of contemplated Si-based devices incorporating the invention includes: 1. a variety of heterotransistor devices, 2. optical waveguides, 3. electrically pumped optical amplifiers, 4. electrooptical modulators; waveguided and free space, 5. laser diodes, 6. light emitting diodes, 7. photodetectors, 8. integrations of the foregoing components, 9. integrations of the above with Si electronics on the same substrate. The MQW versions of the devices can use band-to-band or intersubband transitions.

Figure 12:
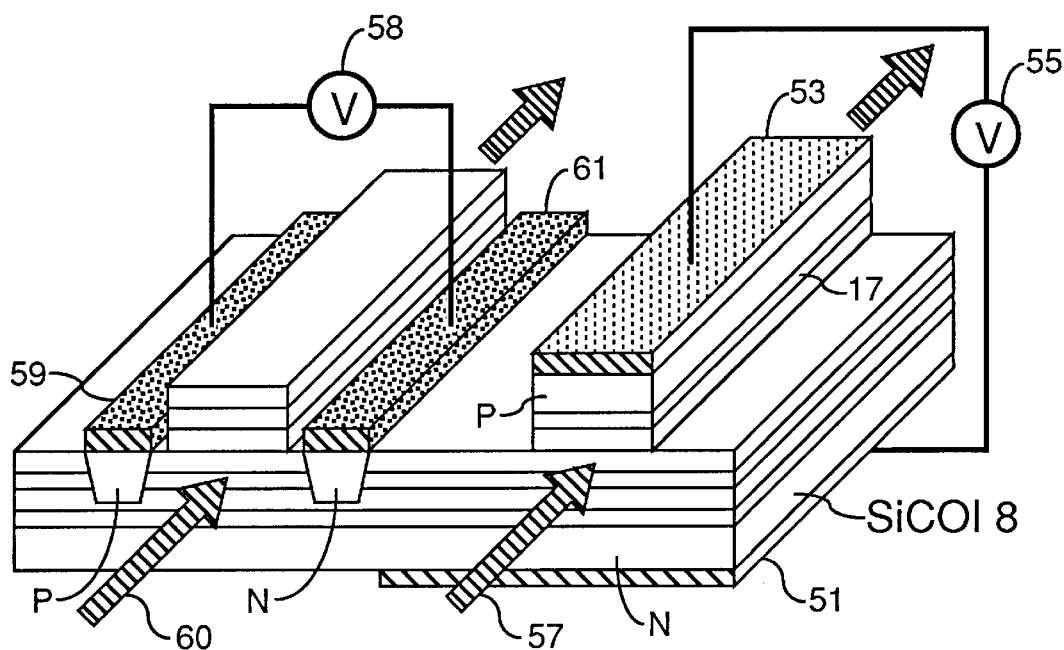
FIG. 12 illustrates placement of the novel SiCOI substrate unit under two types of electro-optic devices.

FIG. 12 shows what a typical waveguided MQW light modulator would look like. The right hand portion of the figure discloses a vertical pin or nin arrangement whereby a lower base electrode 51 and an upper strip electrode 53 are connected to voltage source 55 for controlling modulation of light beam 57. In accordance with the invention, our novel SiCOI substrate unit 8 is positioned beneath MQW stacks 17, previously described. The left hand portion of the figure shows a horizontal pin or nin arrangement whereby voltage source 58 is connected to electrodes 59 and 61 for modulating light beam 60. The P and N regions, well known in the art, are also shown in contact with the electrodes.

While preferred embodiments have been shown, other equivalent variations will occur to those skilled in the art and thus the scope of the invention is to be limited solely by the terms of the following claims and art recognized equivalents thereof.

We claim:

1. A semiconductor device having an electric field applied thereto comprising:

(a) a silicon carbide-on-insulator (SiCOI) substrate having an upper silicon carbide crystalline layer having a thickness of 500 angstroms or less;

(b) a heterostructure of a stack of coherently strained multiple quantum wells having AlN barrier layers epitaxially grown over said SiCOI; and (c) wherein said heterostructure comprises an MQW stack of z-AlN barrier layers in tension interleaved with z-AlGaN quantum well layers in compression and wherein a strain relieved AlGaN buffer layer is formed between a lowermost z-AlN layer in tension and an upper 3C SiC (100) layer of said SiCOI.

2. The device of claim 1 wherein said buffer layer comprises $z-Al_{.83}Ga_{.17}N$ and said AlGaN layers in compression comprise $z-Al_{.66}Ga_{.34}N$.

3. A semiconductor device having an electric field applied thereto comprising:

(a) a silicon carbide-on-insulator (SiCOI) substrate having an upper silicon carbide crystalline layer having a thickness of 500 angstroms or less; and (b) a heterostructure of a stack of coherently strained multiple quantum wells having AlN barrier layers epitaxially grown over said SiCOI; and (c) wherein said heterostructure comprises a MQW stack of w-AlN barrier layers in tension interleaved with w-AlGaN quantum well layers in compression and wherein a strain relieved w-AlGaN buffer layer is formed between a lowermost w-AlN layer in tension and an upper 6H SiC (0001) layer of said SiCOI.

4. The device of claim 3 wherein said buffer layer comprises $w-Al_{.8}Ga_{.2}N$ and said w-AlGaN layers in compression comprise $w-Al_{.6}Ga_{.4}N$.

* * * * *